United States Patent
Rajagopalan et al.

(10) Patent No.: US 10,801,100 B2
(45) Date of Patent: Oct. 13, 2020

(54) MULTIMODAL MICROSTRUCTURE MATERIAL AND METHODS OF FORMING SAME

(71) Applicants: Jagannathan Rajagopalan, Tempe, AZ (US); Rohit Berlia, Tempe, AZ (US)

(72) Inventors: Jagannathan Rajagopalan, Tempe, AZ (US); Rohit Berlia, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/568,064

(22) Filed: Sep. 11, 2019

(65) Prior Publication Data

US 2020/0080185 A1    Mar. 12, 2020

Related U.S. Application Data

(60) Provisional application No. 62/729,613, filed on Sep. 11, 2018.

(51) Int. Cl.
| | |
|---|---|
| *C23C 14/02* | (2006.01) |
| *C23C 14/08* | (2006.01) |
| *C23C 30/00* | (2006.01) |
| *B82Y 30/00* | (2011.01) |
| *B82Y 40/00* | (2011.01) |

(52) U.S. Cl.
CPC .......... *C23C 14/025* (2013.01); *C23C 14/085* (2013.01); *C23C 30/005* (2013.01); *B82Y 30/00* (2013.01); *B82Y 40/00* (2013.01)

(58) Field of Classification Search
CPC .............................. C23C 30/005; C23C 14/025
See application file for complete search history.

(56) References Cited

U.S. PATENT DOCUMENTS

| | | | |
|---|---|---|---|
| 6,638,374 | B2 | 10/2003 | DeHaven et al. |
| 6,723,186 | B2 | 4/2004 | Lee et al. |
| 7,445,810 | B2 * | 11/2008 | Fartash ................ B41J 2/14129 239/602 |
| 7,498,058 | B2 * | 3/2009 | Harris ................. C03C 17/3417 427/255.19 |
| 10,385,440 | B2 | 8/2019 | Rajagopalan et al. |
| 2018/0229308 | A1 | 8/2018 | Kecskes et al. |
| 2019/0345595 | A1 | 11/2019 | Rajagopalan et al. |

FOREIGN PATENT DOCUMENTS

WO    2016077136 A1    5/2016

OTHER PUBLICATIONS

R. Sarkar, C. Ebner, E. Izadi, C. Rentenberger, J. Rajagopalan. Revealing anelasticity and structural rearrangements in nanoscale metallic glass _lms using in situ TEM di_raction. Materials Research Letters (2016) DOI:10.1080/21663831.2016.1228709.

E. Izadi, A. Darbal, R. Sarkar, J. Rajagopalan. Grain rotations in ultra_ne-grained aluminum _lms studied using in situ TEM straining with automated crystal orientation mapping, Materials and Design vol. 113, 186{194 (2016).

C. Ebner, R. Sarkar, J. Rajagopalan, and C. Rentenberger, Local, atomic-level elastic strain measurements of metallic glass thin _lms by electron di_raction, Ultramicroscopy 165, 5158, 2016.

E. Izadi and J. Rajagopalan, Texture dependent strain rate sensitivity of ultra_negrained aluminum _lms, Scripta Materialia 114, 65-69, 2016.

R. Sarkar, C. Rentenberger and J. Rajagopalan, Electron beam induced artifacts during in situ TEM deformation of nanostructured metals, Scienti_c Reports 5, 16345, 2015.

Davazoglou, D. et al., "Selective chemical vapor deposition of copper on AZ 5214™ -patterned silicon substrates", Journal of Vacuum Science & Technology B, Jun. 2001, vol. 19, No. 3, 759-761 <DOI:10.1116/1.1362680>.

Grovenor, C. et al., "The development of grain structure during growth of metallic films", Acta Metallurgica, May 1984, vol. 32, No. 5, pp. 773-781 <DOI:10.1016/0001-6160(84)90150-0>.

Landis, S. et al., "Domain structure of magnetic layers deposited on patterned silicon", Applied Physics Letters, Oct. 1999, vol. 75, No. 16, pp. 2473-2475 <DOI:10.1063/1.125052>.

Levine, I. et al., "Epitaxial two dimensional aluminum films on silicon (111) by ultra-fast thermal deposition", Journal of Applied Physics, Jun. 2012, vol. 111, No. 12, article 124320, 9 pages <DOI:10.1063/1.4730411>.

Vopsaroiu, M. et al., "Grain size effects in metallic thin films prepared using a new sputtering technology", Journal of Optoelectronics and Advanced Materials, Oct. 2005, vol. 7, No. 5, pp. 2713-2720.

\* cited by examiner

*Primary Examiner* — Tabatha L Penny
(74) *Attorney, Agent, or Firm* — Snell & Wilmer L.L.P.

(57) ABSTRACT

Metallic materials with multimodal microstructure and methods of forming the metallic materials are disclosed. Exemplary methods allow for tuning of desired properties of the metallic materials and of devices including the metallic materials.

19 Claims, 20 Drawing Sheets

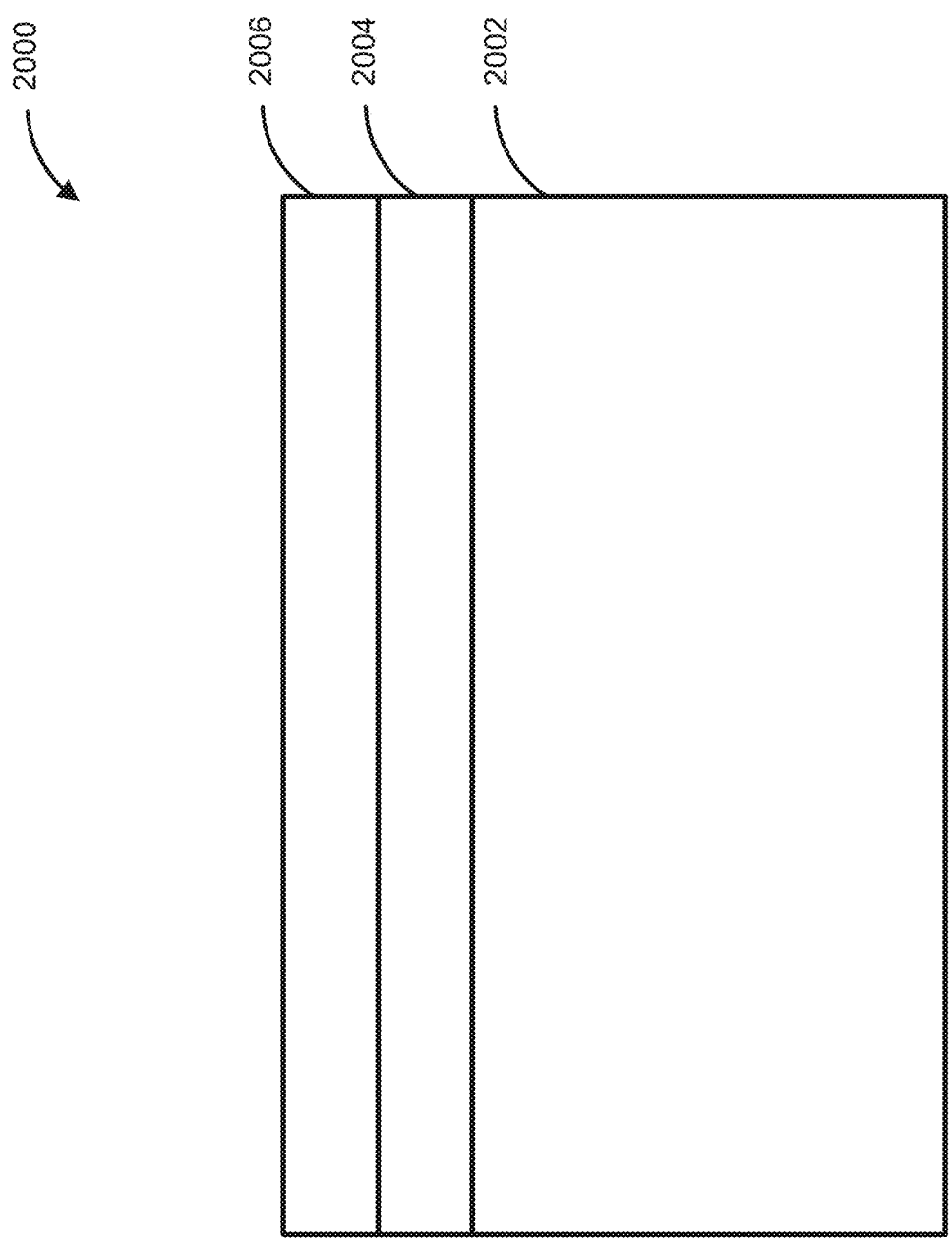

MULTIMODAL MICROSTRUCTURE MATERIAL AND METHODS OF FORMING SAME

CROSS-REFERENCE TO RELATED APPLICATIONS

This application claims the benefit of U.S. Provisional Application No. 62/729,613, entitled MULTIMODAL MICROSTRUCTURE MATERIAL AND METHODS OF FORMING SAME, and filed Sep. 11, 2018, the contents of which are hereby incorporated herein by reference.

STATEMENT REGARDING FEDERALLY-SPONSORED RESEARCH OR DEVELOPMENT

This invention was made with government support under contract numbers 1454109 and 1563027 awarded by the National Science Foundation. The government has certain rights in the invention.

FIELD OF THE DISCLOSURE

The present disclosure generally relates to metallic materials and methods of forming the materials. More particularly, the disclosure relates to metallic materials with multimodal microstructure and to methods of forming the same.

BACKGROUND OF THE DISCLOSURE

The development of structural materials with enhanced mechanical performance is one of the key challenges facing the civil infrastructure, automotive and aerospace sectors. While the physical and mechanical properties that are important are often application specific, relatively high strength and ductility are often desired. Unfortunately, strong materials (e.g., ceramics) are typically brittle and ductile materials (e.g., metals and metallic alloys) usually have low to moderate strength, presenting what is commonly referred to as the strength-ductility trade-off. Over the years, tremendous effort has been directed towards overcoming this strength-ductility trade-off. Examples of techniques that are used to address the strength-ductility trade-off include solid solution strengthening, transformation and precipitation hardening, and grain boundary strengthening.

One highly promising approach that has resulted from these efforts is the synthesis of materials with multimodal microstructures (MM materials). MM materials, which are comprised of two or more distinct sets of grains with sizes varying from tens of nanometers to several micrometers, offer significantly higher strength than coarse-grained (CG) materials and also possess considerable ductility. For instance, gradient nanostructured (GNS) materials are one class of MM materials, which have surface layers composed of nanocrystalline (NC) grains (average cross-sectional/lateral dimension (d), d<100 nm) and a core composed of coarse grains (d>1000 nm). The NC and coarse grains are bridged by ultrafine grains (100 nm<d<1000 nm). GNS materials can deform up to 50% strain in tension before failure, while exhibiting 2-3 times the strength of CG materials.

While MM materials show promise of obtaining a desired combination of strength and ductility, there has been little or no work to determine how various factors, such as the relative volume fraction of coarse and NC grains, relative sizes of various grains (e.g., coarse grains and NC grains), and/or spatial distribution of the grains influence the properties of MM materials. A significant limiting factor for pursuing such studies is the lack of a robust synthesis technique through which key microstructural variables (e.g., size, volume fraction, spatial distribution of grains, and the like) can be independently controlled. For instance, in a surface mechanical attrition treatment (SMAT) process, which is typically used to process GNS materials, it is difficult to control the size, dispersion and spatial distribution of the NC and ultrafine grains.

Thus, there remains a pressing need for new synthesis techniques to create MM materials with highly controlled microstructures, the properties of which can be tuned as desired.

SUMMARY OF THE DISCLOSURE

Various embodiments of the present disclosure relate to methods of forming a metallic material with multimodal microstructure, to metallic materials and/or films with multimodal microstructure, and to devices including the materials and/or films. While the ways in which various embodiments of the present disclosure address drawbacks of prior techniques for forming or attempting to form material with multimodal microstructure are discussed in greater detail below, in general, various embodiments of the disclosure provide techniques to synthesize metallic or metallic alloy films with precisely controlled multimodal architectures (e.g., grain orientation and/or size distributions). As set forth in more detail below, the materials and films can be composed of two or more distinct sets of grains with, for example, different grain sizes and/or grain orientations. Additionally or alternatively, the materials can include multiple films (e.g., multiple multimodal films) stacked overlying one another to form materials with desired properties. Exemplary techniques described below allow control of the mean size, volume fraction and/or spatial distribution/arrangement of the different sets of grains which, in turn, allows tuning various properties—e.g., mechanical, thermal, and/or electrical properties of materials and films deposited using such techniques. Thus, properties, such as strength, ductility, mechanical energy dissipation, electrical resistivity, thermal conductivity, and the like, can be tailored using exemplary methods disclosed herein.

In accordance with at least one embodiment of the disclosure, a method of forming a metallic material with multimodal microstructure includes the steps of providing a substrate having a patterned surface comprising a first material and a second material and depositing a metallic material directly over the first material and the second material to form a multimodal metallic material. The first or second material can be or include buffer material. In these cases, exemplary methods can further include a step of forming a patterned buffer layer on the substrate surface—e.g., prior to a step of depositing a metallic material. The step of forming a patterned buffer layer can include depositing a layer of buffer material, patterning the layer of buffer material, and etching a portion of the layer of buffer material. In accordance with various examples, a microstructure of the first material and a microstructure of the second material are different, such that a microstructure of the metallic material deposited directly over the first material and a microstructure of the metallic material deposited directly over the second material are different. By way of examples, the first material can be monocrystalline (single crystal) and/or the second material can be amorphous or polycrystalline. The microstructure of the metallic material deposited directly over the first material can be monocrystalline. The microstructure of the metallic material deposited directly over the second material can be or include one or more of nanocrystalline and ultra-fine grained. As set forth in more detail below, the size, shape, distribution, and relative volumes of first and second materials and/or the metallic material deposited directly over the first material and/or the metallic material deposited directly over the second material can be controlled or manipulated to obtain desired material/film properties.

In accordance with additional embodiments of the disclosure, a method of forming a metallic material with multimodal microstructure includes the steps of providing a substrate and forming multiple layers overlying the substrate. The substrate can include a patterned surface comprising a first material and a second material. The layers can include one or more metallic and/or buffer materials as described herein.

In accordance with at least one additional embodiment of the disclosure, a multimodal metallic film includes nanocrystalline structures and ultra-fine grain structures, wherein an average cross-sectional and/or lateral dimension of the nanocrystalline structures ranges from about 5 nm to about 100 nm and an average cross-sectional and/or lateral dimension of the ultra-fine grain structures ranges from about 100 nm to about 1000 nm.

In accordance with at least one additional embodiment of the disclosure, a metallic material is formed according to a method disclosed herein.

And, in accordance with at least one additional embodiment of the disclosure, a device includes a metallic material (e.g., a metallic material with multimodal microstructure) as described herein, such as a metallic material with multimodal microstructure formed according to a method set forth herein.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 20 illustrates a structure in accordance with additional examples of the disclosure.

Figure 1:
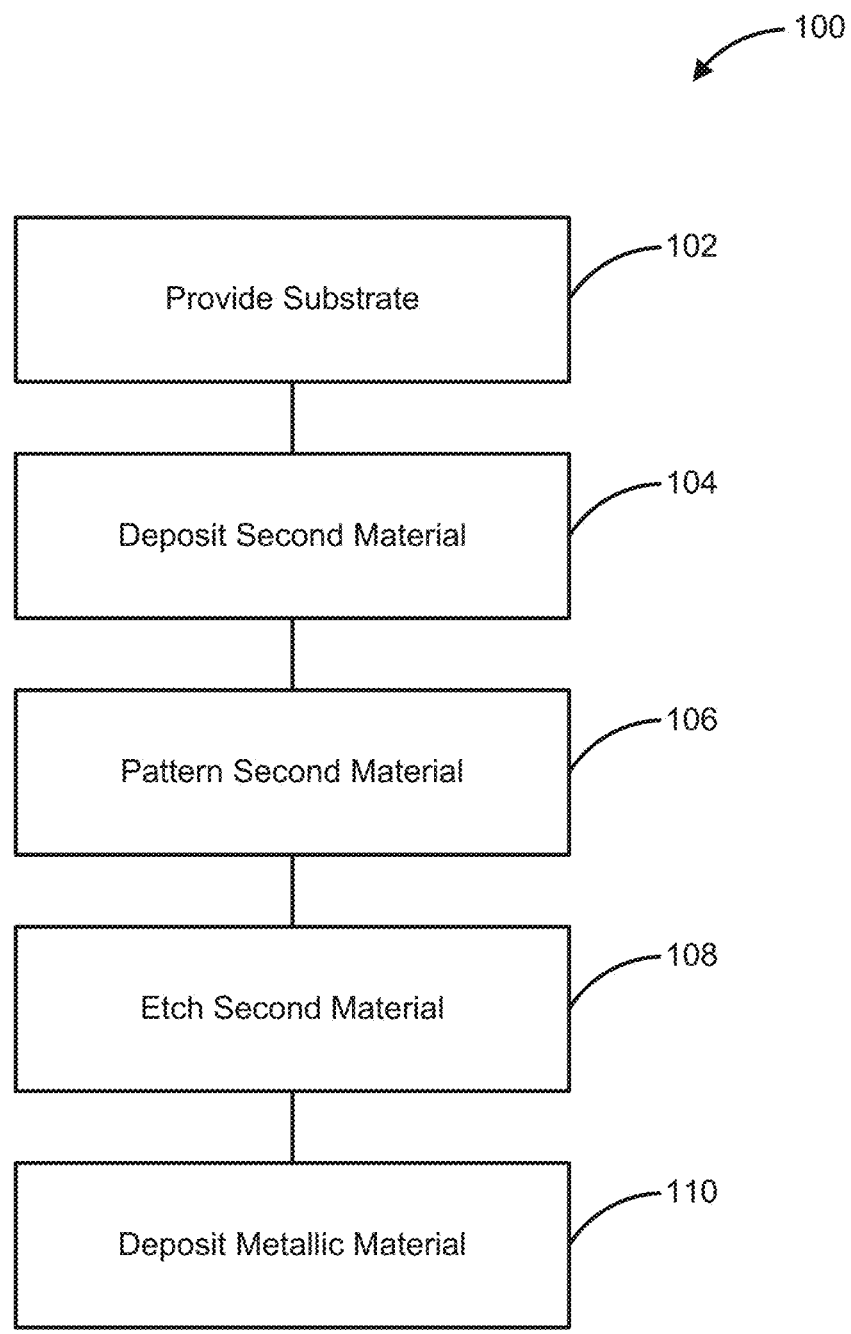
FIG. 1 illustrates a method of forming a metallic material and device structures including the metallic material in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to techniques to synthesize metallic or metallic alloy materials (collectively referred to herein as metallic material) or films with precisely controlled multimodal architectures (e.g., grain size distributions and/or grain orientations). The synthesized films include two or more distinct sets of grains that can vary in, for example, mean size, volume fraction and/or spatial distribution/arrangement of the different sets of grains which, in turn, allow tuning of various film/material properties, such as ductility, mechanical energy dissipation, electrical resistivity, thermal conductivity, and the like. Films and materials as described herein can be used in the manufacture of, for example, microelectromechanical systems (MEMS), mechanical damping of micro/nanoscale systems, as coatings for structural materials, and the like.

As used herein, the term "film" refers to material that is deposited onto a surface of a substrate. A film can be continuous or discontinuous.

As used herein, a "substrate" refers to any material having a surface onto which material can be deposited. A substrate can include a bulk material, such as silicon (e.g., single crystal silicon), and may include one or more layers overlying the bulk material. Exemplary materials suitable for use as a substrate include silicon, germanium, silicon germanium, quartz, zinc oxide, and rock salt (NaCl). By way of particular example, a substrate can be or include (111) or (100)-oriented single crystal silicon substrates—e.g., wafers.

Turning now to the figures, FIGS. 1-7 illustrate exemplary methods of forming a metallic material with multimodal microstructure and structures formed using the methods. Generally, exemplary methods include the steps of providing a substrate having a patterned surface comprising a first material and a second material; and depositing a metallic material directly over the first material and the second material to form a multimodal metallic material—e.g., wherein a microstructure of the first material and a microstructure of the second material are different, and wherein a microstructure of the metallic material deposited directly over the first material and a microstructure of the metallic material deposited directly over the second material are different.

Exemplary first materials can be or include any of the substrate materials noted above. Additionally, or alternatively, a first material can include a buffer material. Exemplary buffer materials include one or more metals, such as one or more metals selected from the group consisting of nickel, copper, vanadium, titanium, aluminum, copper, iron, and silver. Generally, a buffer material grows epitaxially over a monocrystalline material and upon which another monocrystalline material can grow.

Exemplary second materials can be or include, for example, a non-monocrystalline material, such as amorphous or polycrystalline material. Specific examples of second material include materials selected from the group consisting of silicon nitride, silicon oxynitride, aluminum, titanium nitride, and aluminum oxide.

The metallic material can be or include elemental metal or an alloy. Exemplary elemental metals include metal selected from the group consisting of aluminum, copper, iron, nickel, silver, chromium, vanadium, titanium, and cobalt. Exemplary alloys include one or more of dilute alloys of aluminum, copper, iron, silver, nickel, titanium, and chromium, where a dilute alloy includes one of these base metals and up to 10 atomic percent of another metal, such as nickel, iron, copper, cobalt, tantalum, tungsten or manganese.

The figures described below illustrate specific examples of the disclosure. Unless otherwise stated, the invention is not limited to such examples.

FIG. 1 illustrates a method 100 in accordance with examples of the disclosure.

Figure 2:
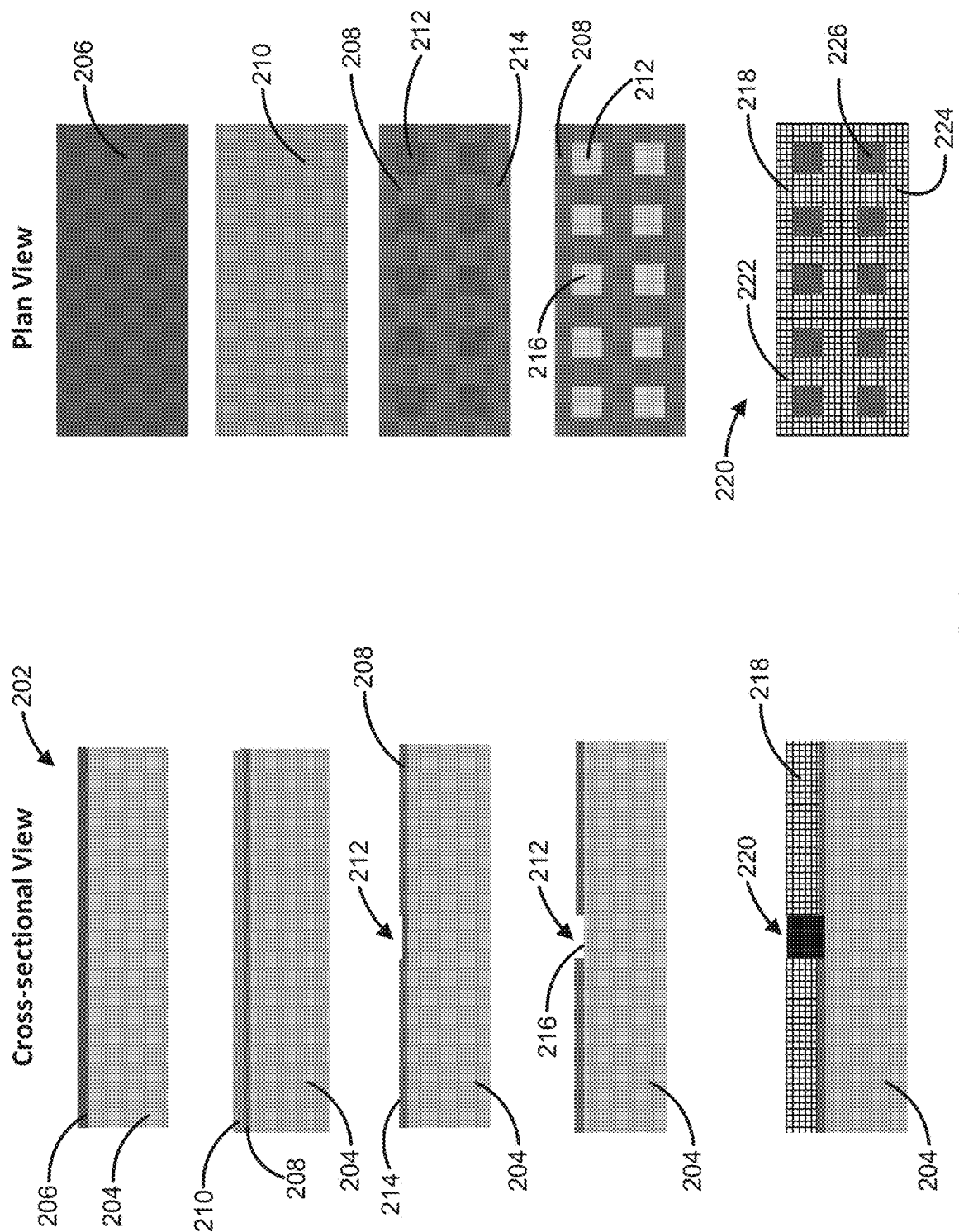
FIG. 2 illustrates structures in accordance with exemplary embodiments of the disclosure.

Method 100 includes the steps of providing a substrate (step 102), depositing a second material (step 104), patterning the second material (step 106), etching the second material and, if desired, removing the regrown native oxide (step 108), and depositing metallic material (step 110). FIG. 2 illustrates corresponding structures for steps of method 100.

Step 102 can include providing a substrate 202—e.g., a single crystal substrate. The substrate can be or include the first material. Substrate 202 can include any of the first material and/or substrate materials described herein. In the illustrated example, substrate 202 includes bulk material 204, such as bulk semiconductor material (e.g., silicon), and a native oxide layer (e.g., silicon oxide) 206. Oxide layer 206 can be removed using, for example, hydrofluoric acid (e.g., concentration of about 1% to about 49%) at a temperature of about 20° C. to about 50° C.

Next, during step 104, a thin film (e.g., 10-20 nm) of second material—e.g., amorphous (e.g., $SiN_x$, $Al_2O_3$, TiN) or polycrystal (e.g., Al, Ag, Cr) layer 208 can be deposited onto a surface of bulk material 204. As illustrated, bulk material 204 may be cleaned or etched prior to the deposition to remove native oxide 206. Layer 208 can be deposited using, for example, low-pressure chemical vapor deposition (CVD), CVD, atomic layer deposition (ALD), physical vapor deposition (PVD) or the like.

Second material layer 208 is then patterned (step 106) with a layer of photoresist 210 and etched (step 108) to expose the underlying single crystal substrate/bulk material 204 (first material) in region 212 and form a patterned amorphous or polycrystal material (second material) in region 214. Patterning can be performed using any suitable (e.g., positive or negative) photoresist and developer to create openings in the photoresist layer 210.

In accordance with examples of the disclosure, second material layer 208 can be dry etched (e.g., using reactive ion etching) or wet etched (e.g., using an appropriate acid or base) or sputter etched (e.g., using Ar or other inert gas ions). The dry etchants can be or include one or more of $BCl_3$, $Cl_2$, $CF_4$, $CHF_3$, $SF_6$, $O_2$ and $XeF_2$ and their like. The wet etchants can be or include one or more of hydrochloric acid, nitric acid, acetic acid, potassium hydroxide, phosphoric acid, sulfuric acid and the like. A temperature of the etchant can range from about 20° C. to about 80° C. After etching of second material layer 208, hydrofluoric acid (e.g., concentration of about 1% to about 49%) may be used to remove any native oxide layer that has regrown in region 212 and passivate the surface. A surface of first material 204 may remain passivated in region 212 for a period of about 30 to about 60 minutes. Therefore, step 110 may desirably be performed within this window of time.

During step 110, a layer of metallic material 218 can be directly deposited over first/bulk material 204 and second/amorphous/polycrystalline material 208 to form a multi-modal metallic material 220. Metallic material 218 can be deposited by, for example, sputtering or other chemical or physical vapor deposition (e.g., evaporation, ablation, or the like) process.

In accordance with examples of the disclosure, a pressure within a reaction chamber during step 110 can range from about 1 mTorr to about 30 mTorr. A temperature within the reaction chamber can range from about 20° C. to about 800° C.

In accordance with various examples of the disclosure, metallic material 218 grows epitaxially as a single crystal material 226 on the first material—e.g., areas 212 where the single crystal substrate is exposed (single-crystal metallic material). In regions 222, where the second material is amorphous or polycrystal layer is present, metallic material 218 grows as a non-monocrystalline or polycrystalline material 224.

When metallic films are grown on amorphous or polycrystalline materials (e.g., second material 208) via physical vapor deposition (PVD) processes, their microstructural evolution is usually governed by the Volmer-Weber mechanism. Volmer-Weber growth is comprised of various stages including nucleation, island formation, coalescence and grain coarsening and typically results in a polycrystalline film. The polycrystalline films often have a specific texture in the growth direction (e.g., (111) texture for face centered cubic metals such as Au and Cu), but the in-plane orientation of the grains is typically random. The grain size in the amorphous/polycrystalline areas can be varied from, for example, tens to hundreds of nanometers to micrometers by altering the film thickness, deposition rate, deposition pressure and/or deposition temperature. For example, the microstructure of the metallic material deposited directly over the second material can include one or more of nanocrystalline and ultra-fine grained—e.g., wherein an average cross-sectional and/or lateral dimension of the nanocrystalline structures ranges from about 5 nm to about 100 nm and an average cross-sectional and/or lateral dimension of the ultra-fine grain structures ranges from about 100 nm to about 1000 nm.

In contrast, metal films deposited on crystalline substrates (e.g., first/bulk material 204) can be made to grow with a specific orientation relationship to the underlying substrate—e.g., the films can be grown epitaxially. This mode of growth can be used to generate single crystal films when the substrate (or other underlying layer) is also monocrystalline.

By designing the mask pattern for the first and/or second material suitably, metal films with specific microstructural architectures and precisely controlled size, spatial distribution/arrangement and volume fraction of nanocrystalline and coarse grains can be synthesized. A ratio of a surface area of the first material to a surface area of the second material can range from, for example, about 1:0.02 to about 1:50, about 1:0.75 to about 1:1.25, or about 1:0.8 to about 1:1.2. The pattern of the first or second material can include a plurality of islands of the first material or the second material, the plurality of islands having an average diameter or cross-sectional/lateral dimension of about 500 nm to about 50000 nm. The pattern of the first material and the second material can also be such that the first and second material are co-continuous, bi-continuous or their like with cross-sectional/lateral dimension of about 500 nm to about 50000 nm.

Figure 3:
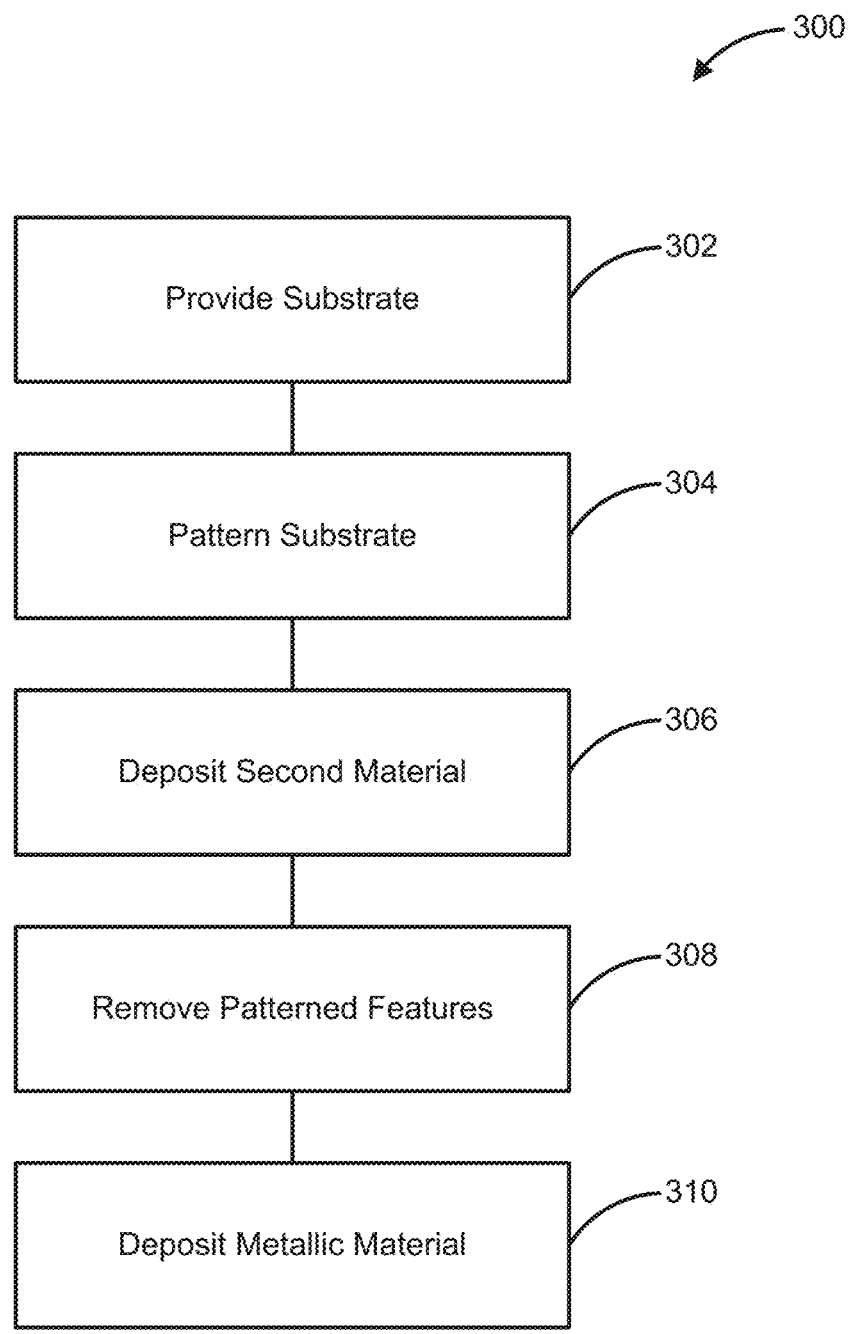
FIG. 3 illustrates a method of forming a metallic material and device structures including the metallic material in accordance with exemplary embodiments of the disclosure.
Figure 4:
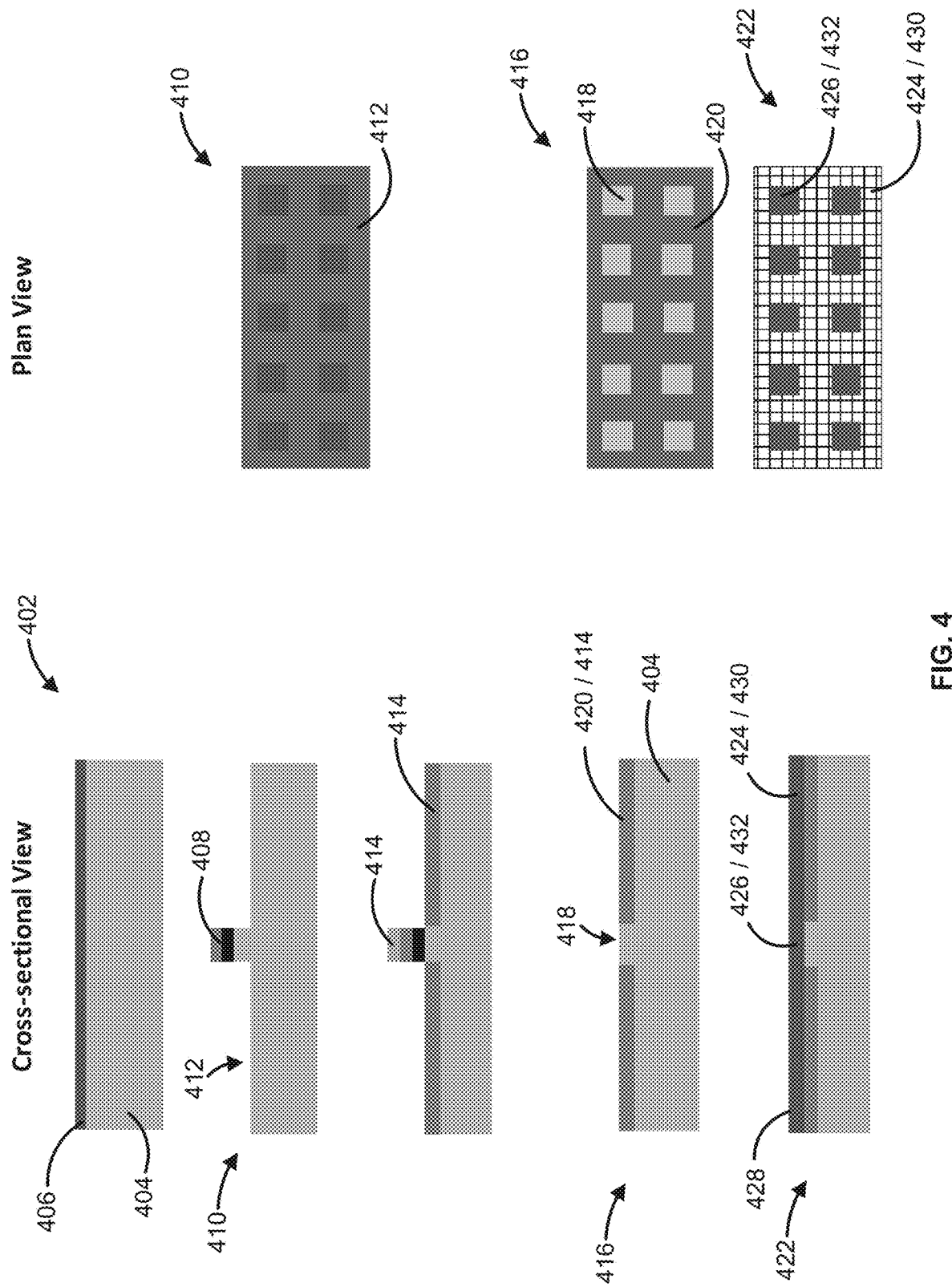
FIG. 4 illustrates structures in accordance with exemplary embodiments of the disclosure.

In accordance with some examples of the disclosure, a surface of the first material and a surface of the second material can be coplanar. An example method of forming coplanar first and second material surfaces is illustrated in FIGS. 3 and 4.

Method 300 includes the steps of providing a substrate (step 302), patterning the substrate (step 304), depositing a second material (step 306), removing patterned features (step 308), and depositing metallic material (step 310).

Step 302 can be the same or similar to step 102. As illustrated in FIG. 4, a substrate 402 can include bulk material 404 and a native oxide layer 406. Bulk material 404 and a native oxide layer 406 can be the same or similar to bulk material 204 and a native oxide layer 206 described above.

During step 304, substrate 402 can be patterned and etched. For example, a layer of photoresist can be coated onto a surface of native oxide 406, patterned, and developed to form patterned photoresist features 408. Native oxide layer 406 and bulk/first material 404 can then be etched (e.g., using techniques described above) to form structure 410, which includes etched regions 412.

During step 306, second material 414 is deposited overlying etched regions 412 and photoresist features 408. A thickness of second material 414 can be about the same height as etch regions 412.

Patterned features 408 are removed during step 308. By way of example, the patterned features can be removed using a lift-off process by dissolving the photoresist in a solvent or photoresist stripper, such as acetone or dimethyl sulfoxide at a temperature of about 20° C. to about 150° C. After the removal of photoresist features 408, a planar structure 416 is formed, which includes a first region 418, including first material 404, and a second region 420, including second material 414.

During step 310, a layer of metallic material 428 can be deposited—e.g., as described above—to form structure 422. Structure 422 includes metallic material 428 grown epitaxially as a single crystal material 432 on the first material—e.g., in areas 426 where the single crystal substrate is exposed (single-crystal metallic material). In regions 424 where second material 414 (e.g., amorphous or polycrystal layer) is present, metallic material 428 grows as a polycrystal 430.

Figure 5:
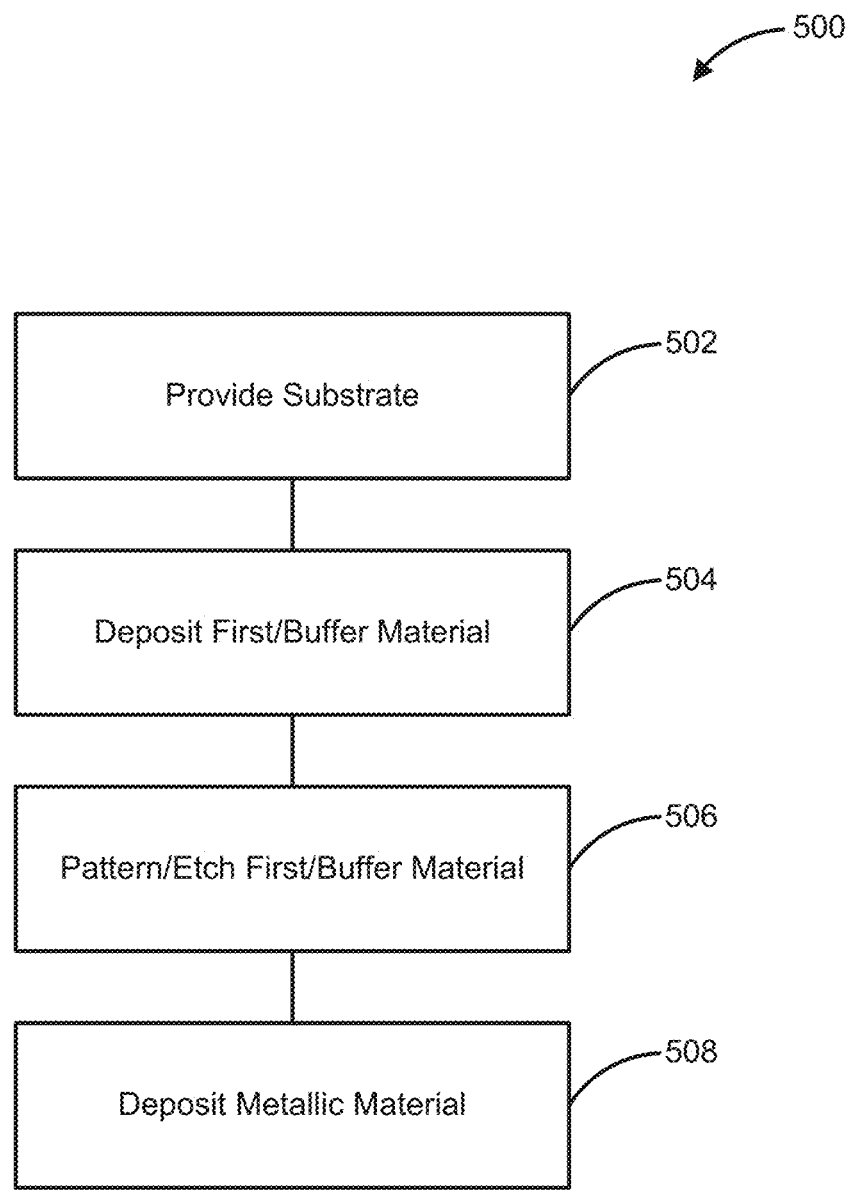
FIG. 5 illustrates a method of forming a metallic material and device structures including the metallic material in accordance with exemplary embodiments of the disclosure.
Figure 6:
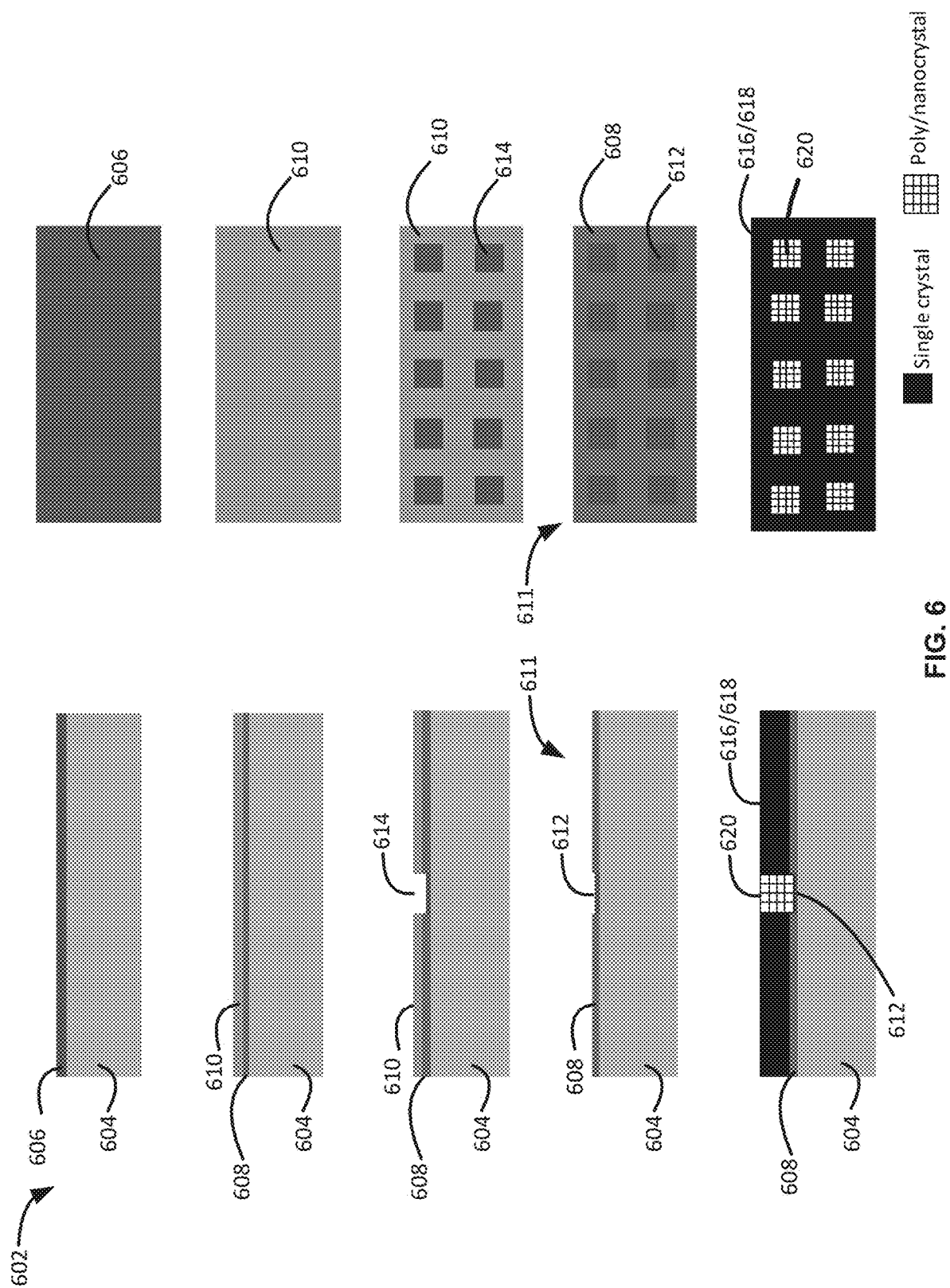
FIG. 6 illustrates structures in accordance with exemplary embodiments of the disclosure.

FIG. 5 illustrates another method 500 in accordance with examples of the disclosure. FIG. 6 illustrates structures formed at various stages of method 500.

Method 500 includes the steps of providing a substrate (step 502), depositing first/buffer material (step 504), patterning/etching the first/buffer material (step 506), and depositing metallic material (step 508).

Providing a substrate step 502 can be the same or similar as step 102 and/or step 302. As illustrated in FIG. 6, a substrate 602 can initially include a bulk material or layer 604 and a (e.g., native) oxide layer 606. Bulk material or layer 604 can be the same or similar to bulk material 204, 404.

During step 504, a first material 608 is deposited. Prior to depositing first material 608, oxide layer 606 can be removed from a surface of substrate 602. Oxide layer 606 can be removed using, for example, hydrofluoric acid, as described above. Once oxide layer 606 is removed, first material 608 is deposited onto a surface of bulk material or layer 604.

In accordance with exemplary embodiments of the disclosure, first material 608 is or includes a buffer material that is epitaxially grown over bulk material 604. For example, first material 608 can include one or more metals, such as one or more metals selected from the group consisting of Ni, Cu, V, Ti, Al, Cu, Fe, and Ag. First material 608 can be deposited using a variety of techniques, such as PVD (e.g., sputtering or evaporation), CVD, or the like. By way of particular example, the first material can include silver and can be deposited using sputtering. A pressure within a reaction chamber during step 504 can range from about 1 mTorr to about 30 mTorr. A temperature within the reaction chamber during step 504 can range from about 20° C. to about 400° C.

Once first material 608 is deposited, first material 608 can be patterned and etched during step 506. By way of example, a layer of photoresist 610 can be deposited onto first material 608—e.g., using spin-coating techniques. Photoresist 610 can then be patterned and developed to form openings in photoresist 610. Using the patterned photoresist as a mask, first material 608 can be etched to form opening 614. Second material 612, such as an oxide—e.g., a native oxide, can form or be formed in a region defined by opening 614—e.g., upon exposure to an ambient atmosphere. Photoresist 610 can then be removed to form structure 611.

During step 508, metallic material 616 is deposited overlying first material 608 and second material 612. Metallic material 616 can form as a monocrystalline material 618 overlying first material 608 and as a non-monocrystalline material 620 overlying second material 612.

Although the examples above illustrate patterns with substantially uniform sizing for the first material and/or second material, the sizing of the patterns (e.g., for the first and/or second material) can be varied to obtain additional distinct groups of grains.

A size and geometry of coarse grains (obtained via epitaxial growth) can be defined by the patterning (e.g., lithography) process. A size of the finer grains can be altered by changing the deposition temperature, pressure and/or rate. For instance, a mean grain size can be increased by increasing the sputtering rate while keeping all other factors constant. The fine grains can be coarsened, if desired, by post-deposition annealing. Annealing can be performed in an inert gas atmosphere at a temperature of about 100° C. to about 800° C.

In accordance with further examples of the disclosure, an aspect ratio of grains can be controlled. Columnar growth can be suppressed by periodically interrupting the deposition process to produce grains that are more equiaxed. Depending on whether columnar or equiaxed microstructures are desired, continuous or interrupted deposition can be used.

Volume fraction and spatial distribution of grains can also be controlled. A volume fraction of the fine grains can be varied by simply changing the area fraction of the first material on the substrate. Similarly, the spatial distribution of coarse and fine grains and their connectivity can be precisely defined by designing the pattering masks appropriately. Thus, the overall architecture—fine grains embedded in a coarse matrix or isolated coarse grains in a fine matrix or a combination of both—can be tailored as desired.

Figure 7:
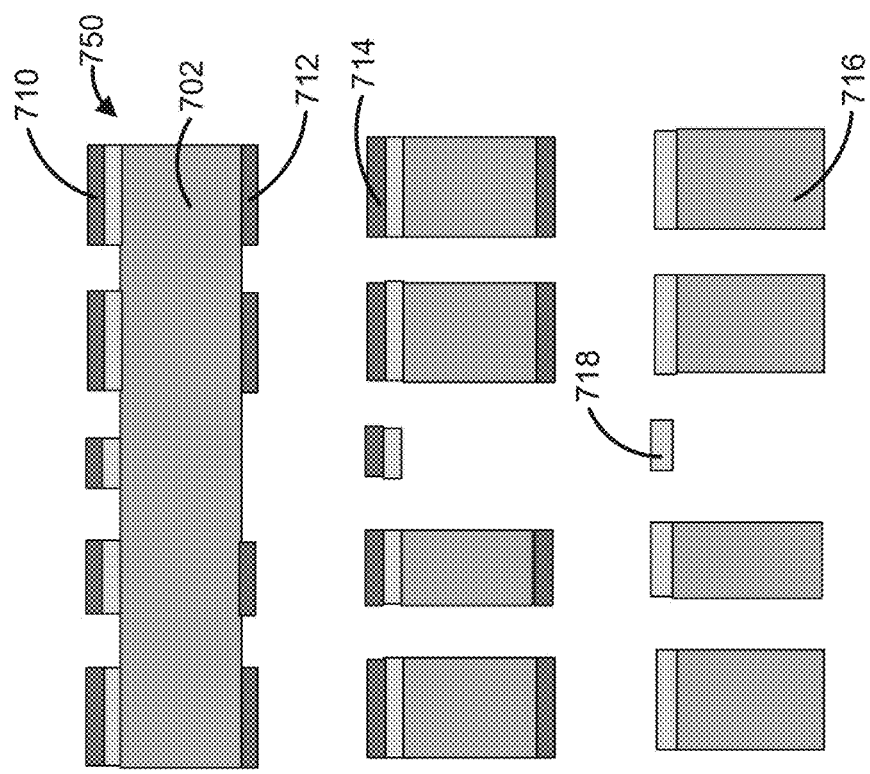
FIG. 7 illustrates structures and devices in accordance with exemplary embodiments of the disclosure.
Figure 7:
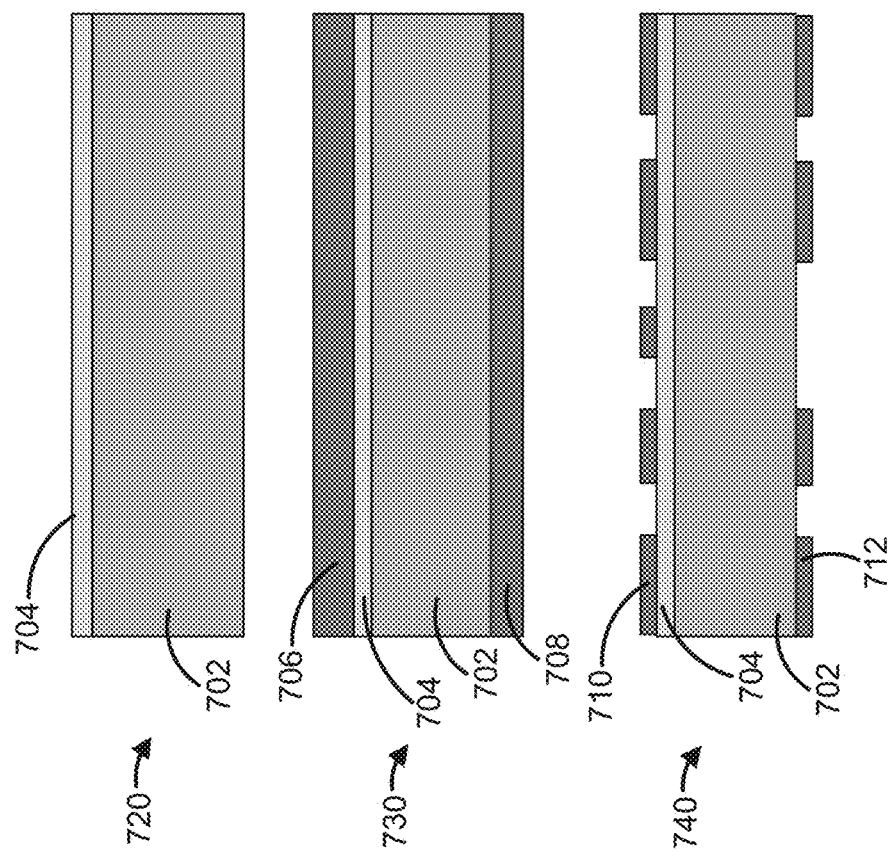

FIG. 7 illustrates a method of forming a MEMS device and the corresponding structures in accordance with additional exemplary embodiments of the disclosure. The method includes providing a substrate, such as substrate 702, and depositing metallic material, and specifically a multimodal microstructure film 704—e.g., using any of methods 100, 200 or 300 described above, overlying substrate 702 to form structure 720. Photoresist layers 706, 708 can then be deposited on substrate 702 surfaces to form structure 730. Photoresist layers 706, 708 can then be patterned and developed to form photoresist features 710, 712 and structure 740. Multimodal microstructure film 704 can then be etched using photoresist features 710 as a template to form structure 750. Alternatively, a pattern of the multimodal microstructure film can include openings. The substrate can then be etched (e.g., using a deep reactive ion etcher or other suitable etch process) to form free-standing structures 714. Photoresist can be removed from free-standing structures 714 to form freestanding devices 716 and/or freestanding films 718.

FIGS. 8-17 illustrate exemplary multimodal microstructure films formed in accordance with examples of the disclosure. These examples of the disclosure are not meant to limit the scope of the disclosure or claims.

Figure 8:
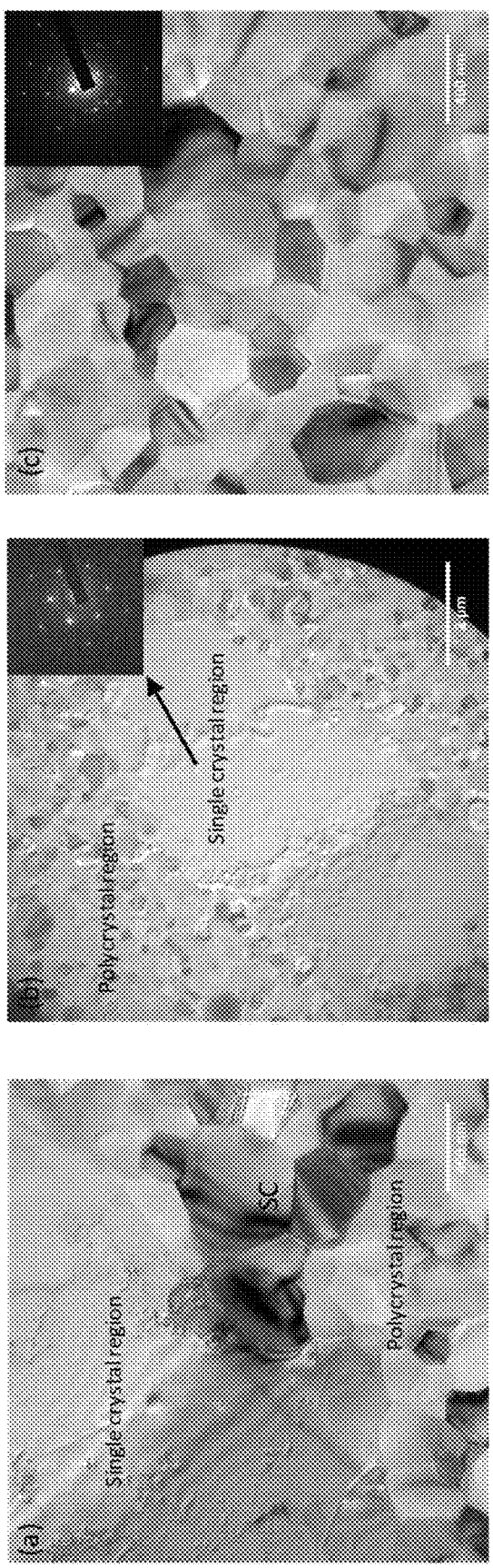
FIGS. 8, 10 and 12 illustrate TEM images of metallic material in accordance with exemplary embodiments of the disclosure.

FIG. 8 illustrates a multimodal microstructure aluminum film synthesized directly using a silicon substrate as the first material and $SiN_x$ as the second material. FIG. 8(a) illustrates a high magnification TEM image of a region containing single crystal and polycrystal aluminum; FIG. 8(b) illustrates a low magnification TEM micrographs of the region containing single crystal and polycrystal aluminum; and FIG. 8(c) illustrates a high magnification TEM image of a polycrystalline region of an aluminum film with multimodal microstructure. Insets in FIG. 8(b) and FIG. 8(c) show the selected area diffraction pattern from a single crystal region and polycrystal region, respectively.

Figure 9:
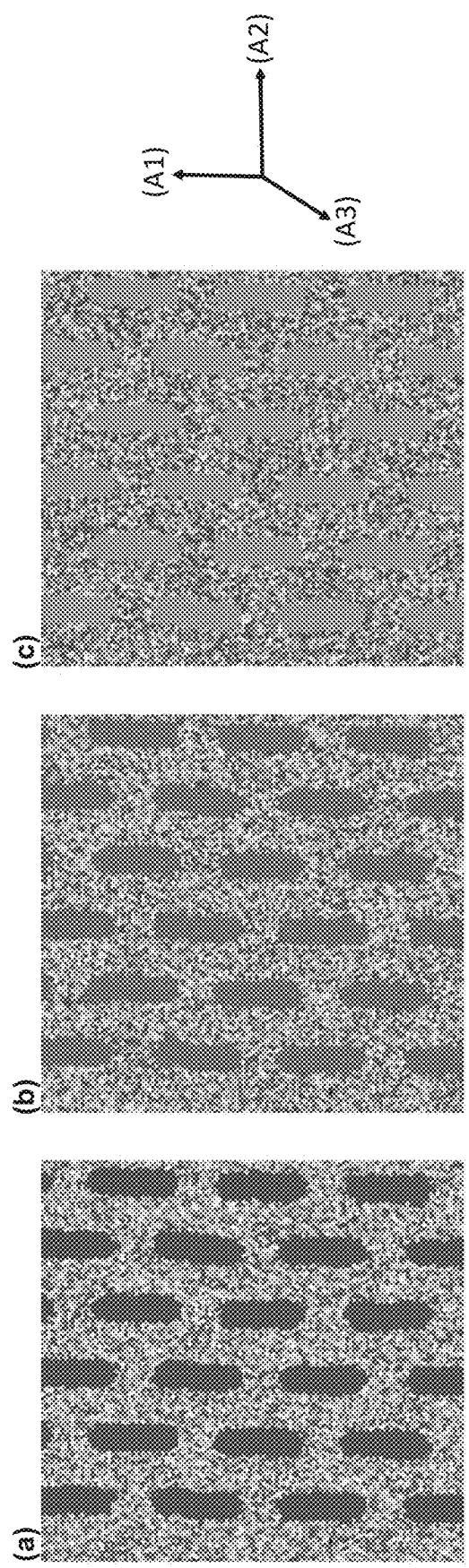
FIGS. 9, 11 and 13-17 illustrate EBSD measurements of metallic material in accordance with exemplary embodiments of the disclosure.

FIG. 9 illustrates EBSD measurements on a multimodal microstructure aluminum film deposited directly on a silicon substrate as the first material and $SiN_x$ as the second material (a) along A3, (b) along A2, and (c) along A1. The large, rounded rectangles are single crystals. The areas surrounding the rounded rectangles are polycrystals.

Figure 10:
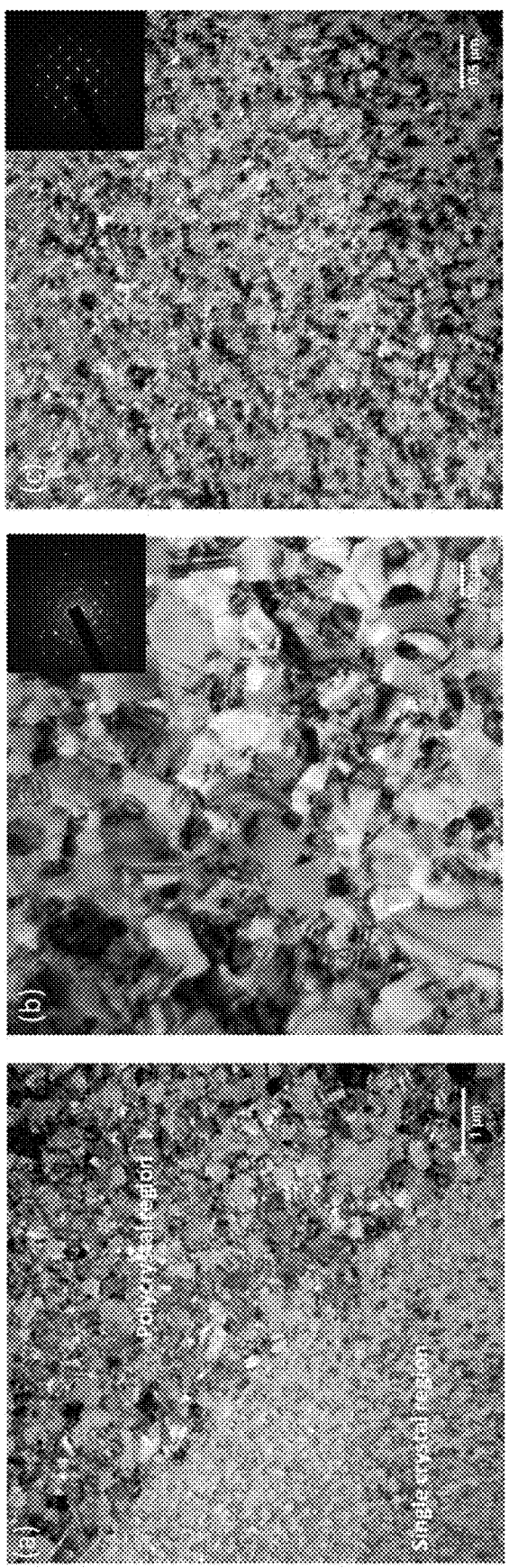

FIG. 10 illustrates TEM images of a copper material with multimodal microstructure. Specifically, FIG. 10 illustrates TEM micrographs of (a) a region containing a single crystal and a polycrystalline region, (b) a polycrystal region at higher magnification, and (c) a single crystal region at higher magnification. Insets in FIG. 10(b) and FIG. 10(c) show the selected area diffraction pattern from a polycrystal region and single crystal region, respectively.

Figure 11:
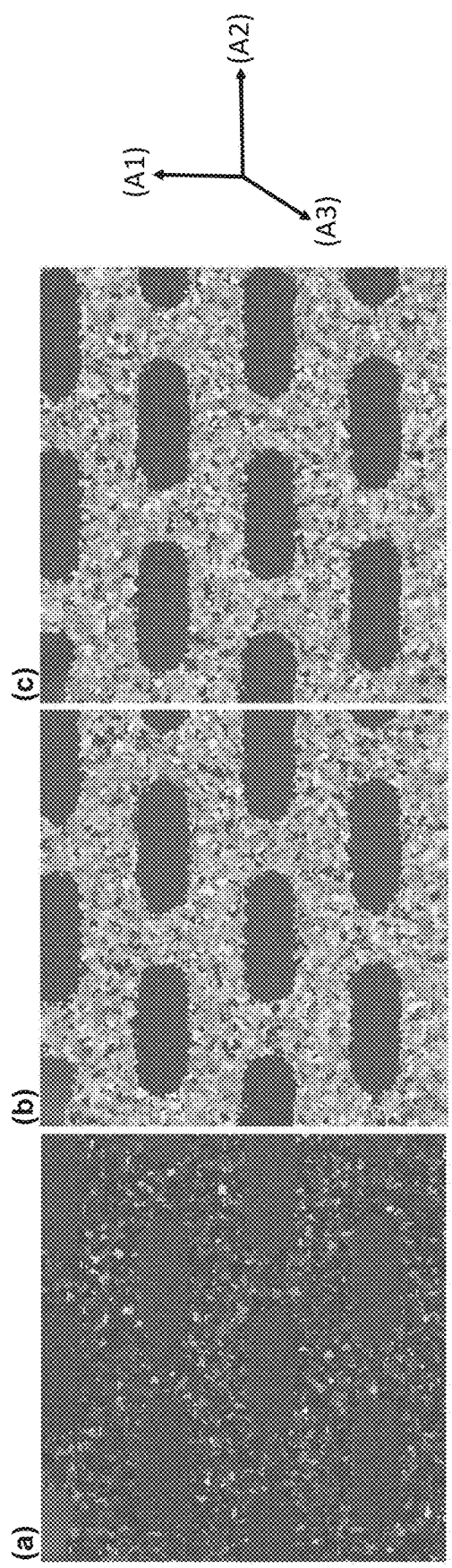

FIG. 11 illustrates EBSD measurements on a multimodal microstructure copper film deposited on a silicon substrate as the first material and $SiN_x$ as the second material, using a method as described herein, (a) along A3, (b) along A2, and (c) along A1. The large, rounded red rectangles are single crystals. The areas surrounding the rounded rectangles are polycrystals.

Figure 12:
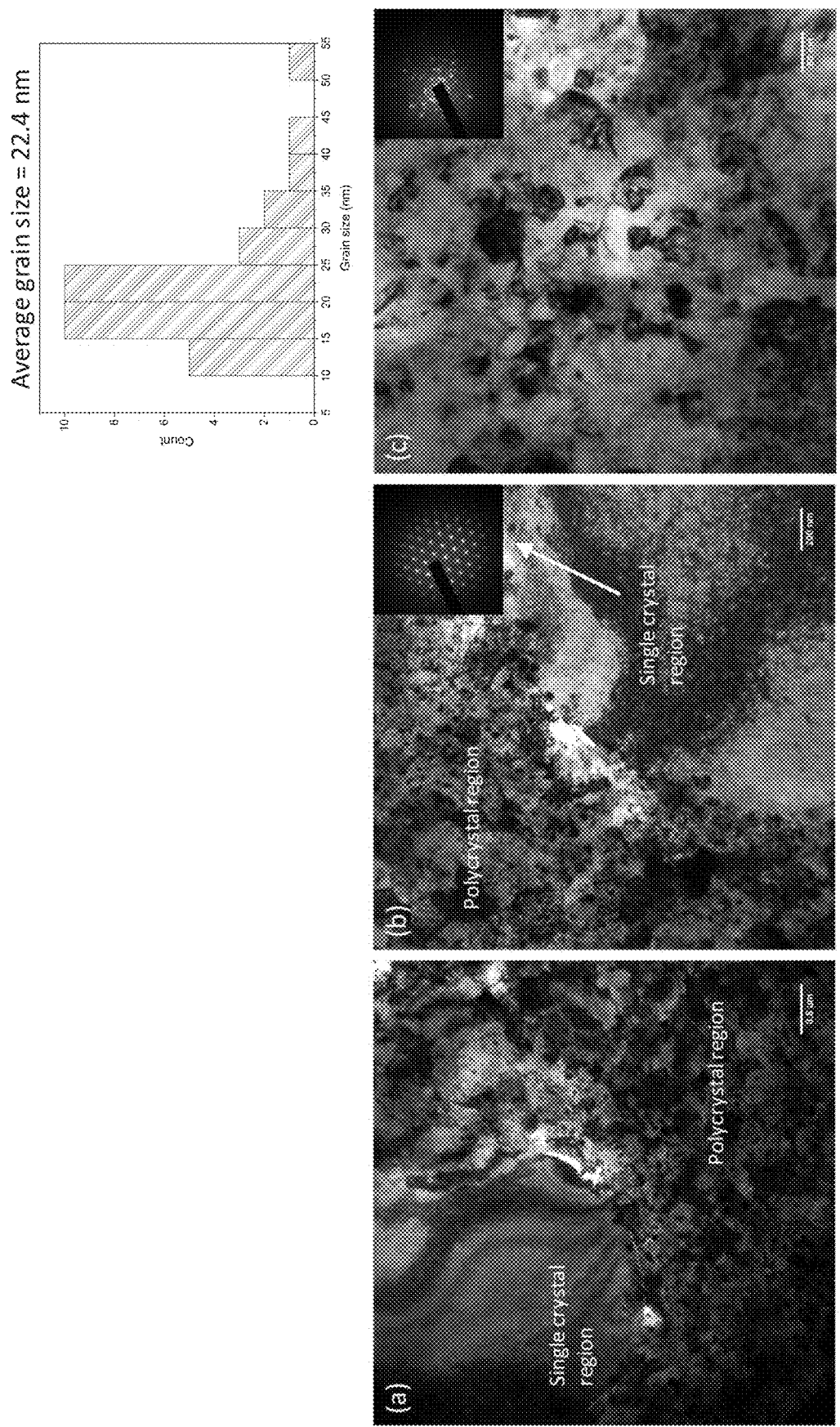

FIG. 12 illustrates an iron metallic material formed according to examples of the disclosure. Specifically, FIG. 12 illustrates (a) a low magnification TEM micrograph of regions containing single crystal and polycrystal iron, (b) a high magnification TEM micrograph of regions containing single crystal and polycrystal iron, and (c) a polycrystal iron portions at higher resolution. The insert illustrates that the average grain size for the polycrystalline film is about 22.4 nm. Insets in FIG. 12(b) and FIG. 12(c) show the selected area diffraction pattern from a single crystal region and polycrystal region, respectively.

Figure 13:
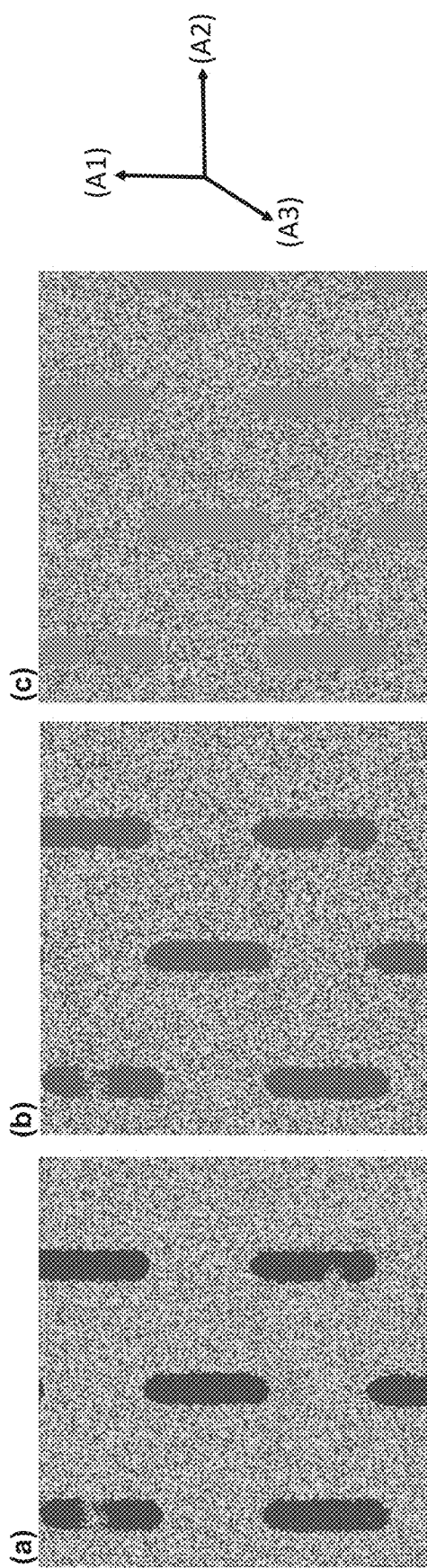

FIG. 13 illustrates EBSD measurement on a multimodal microstructure iron film deposited directly on a silicon substrate as the first material and $SiN_x$ as the second material. (a) along A3, (b) along A2, and (c) along A1. The large, rounded rectangles are single crystals. The areas surrounding the rounded rectangles are polycrystals.

Figure 14:
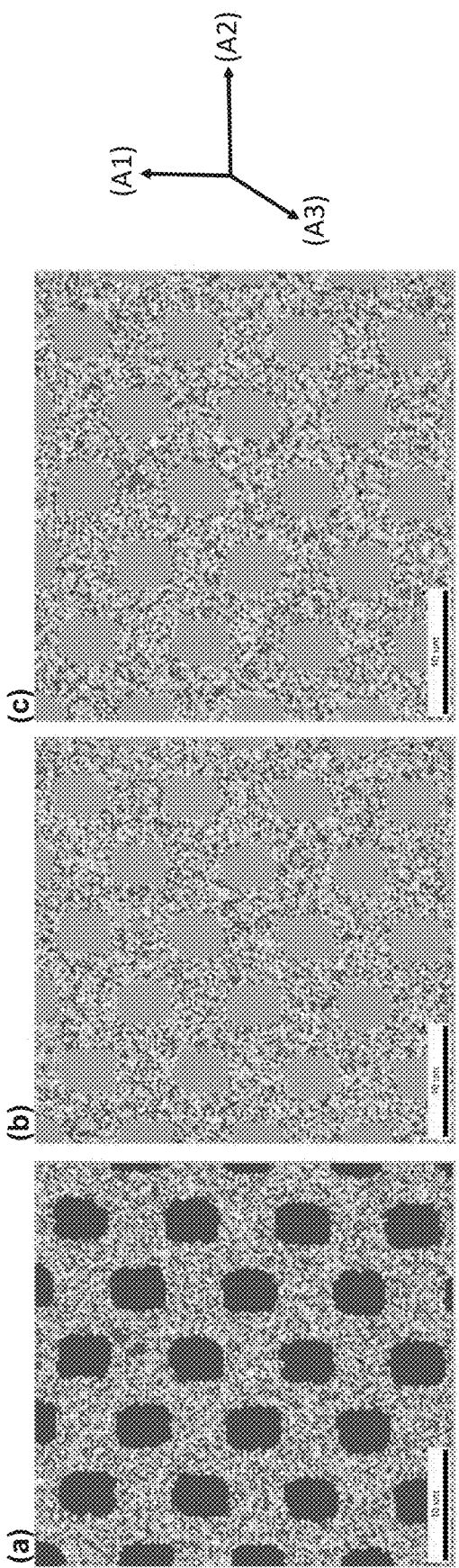

FIG. 14 illustrates EBSD measurement on a multimodal microstructure iron film deposited directly on a silicon substrate as the first material and $SiN_x$ as the second material. (a) along A3, (b) along A2, and (c) along A1. The large, rounded squares are single crystals. The areas surrounding the rounded squares are polycrystals.

Figure 15:
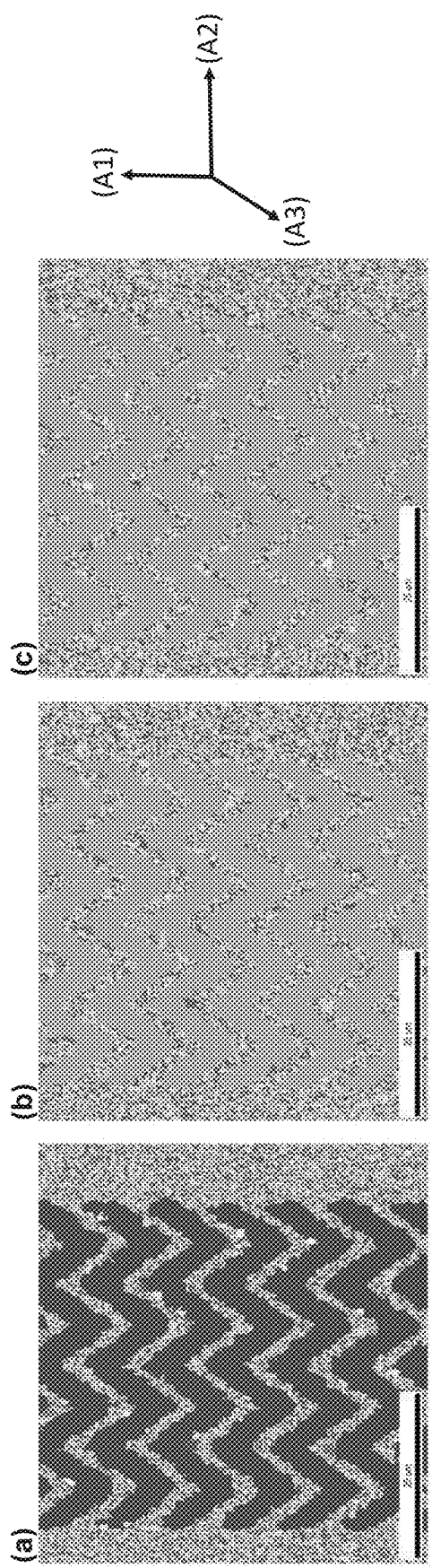

FIG. 15 illustrates EBSD measurements on multimodal microstructure iron film deposited directly on a silicon substrate as the first material and $SiN_x$ as the second material. (a) along A3, (b) along A2, and (c) along A1. The zig-zag patterns are single crystals. The areas surrounding the zig-zag patterns are polycrystals.

Figure 16:
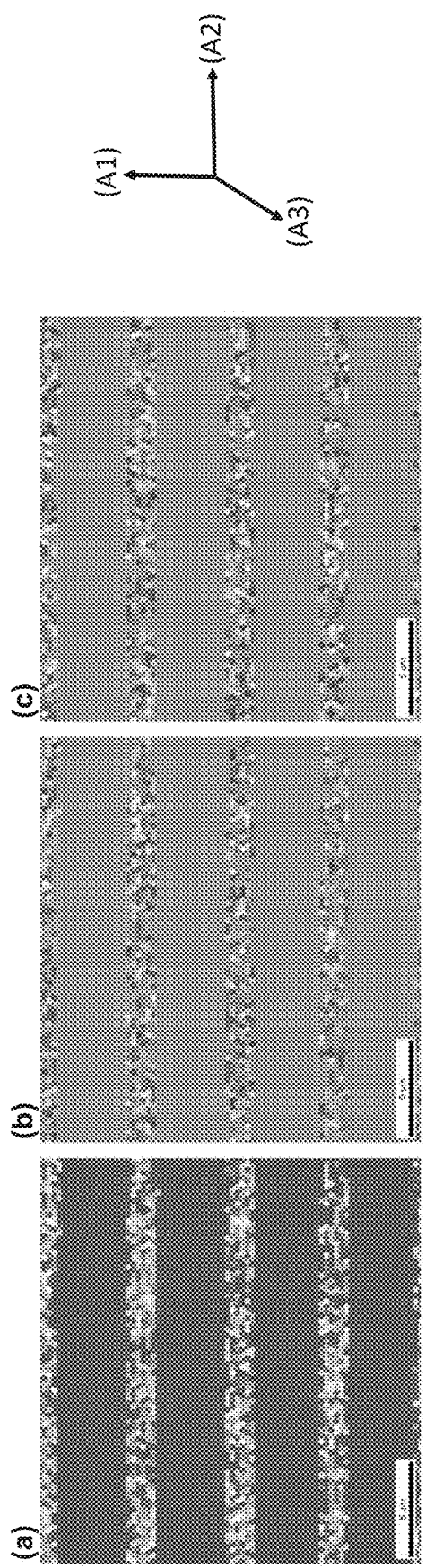

FIG. 16 illustrates EBSD measurements on multimodal microstructure nickel film deposited using a silver buffer layer as the first material and $SiO_2$ as the second material (a) along A3, (b) along A2, and (c) along A1. The large parallel rectangular regions are single crystals. The smaller rectangular regions in between the single crystals are polycrystals.

Figure 17:
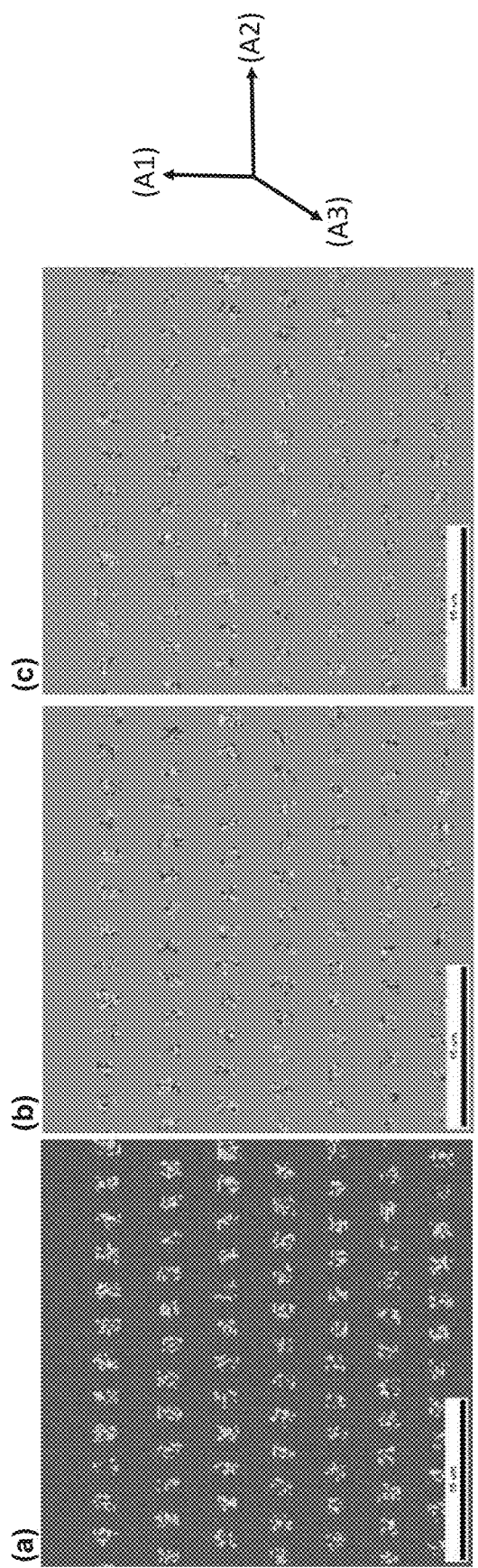

FIG. 17 illustrates EBSD measurements on a multimodal microstructure nickel film deposited using a silver buffer layer as the first material and $SiO_2$ as the second material (a) along A3, (b) along A2, and (c) along A1. The irregularly-shaped smaller regions are polycrystals. They are surrounded by single crystals.

Figure 18:
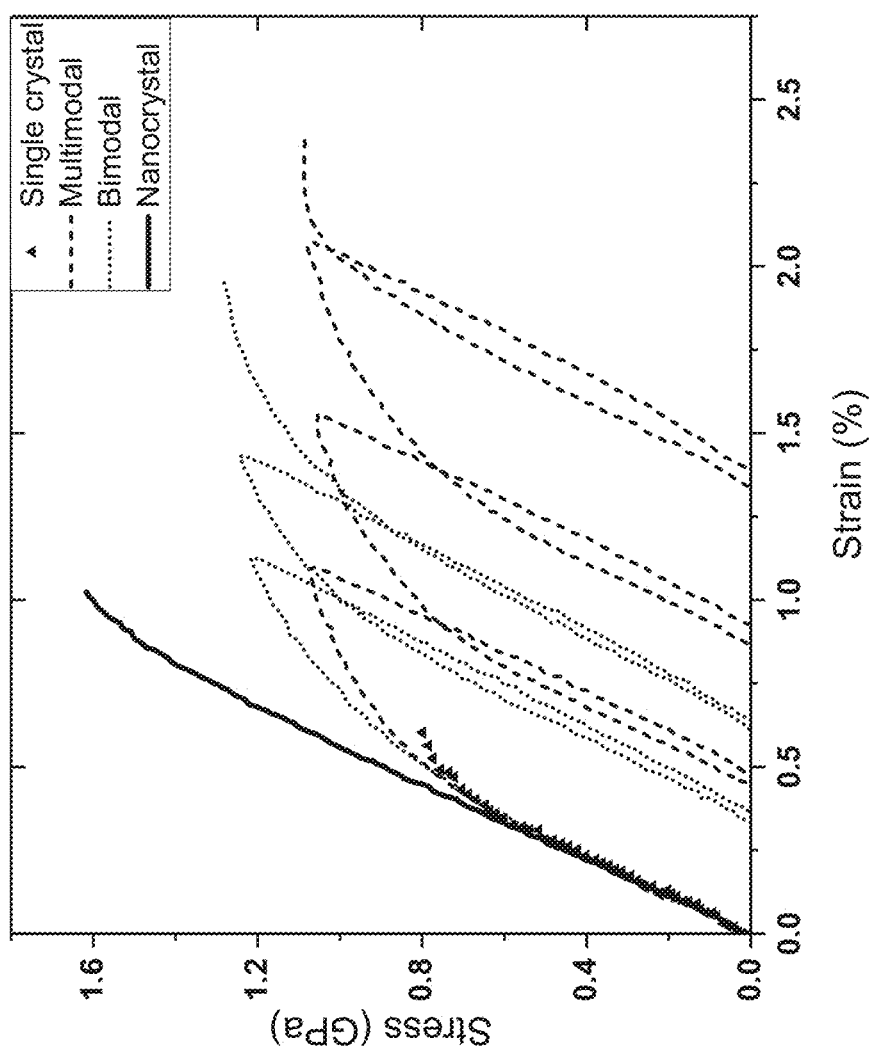
FIGS. 18 and 19 illustrate stress-strain measurements of metallic material in accordance with exemplary embodiments of the disclosure.

FIG. 18 illustrates mechanical behavior of multimodal microstructure iron films, illustrating the difference in mechanical behavior of single crystal, multimodal (single crystal islands surrounded by polycrystals), bimodal (co-continuous poly and single crystals), and nanocrystalline iron films.

Figure 19:
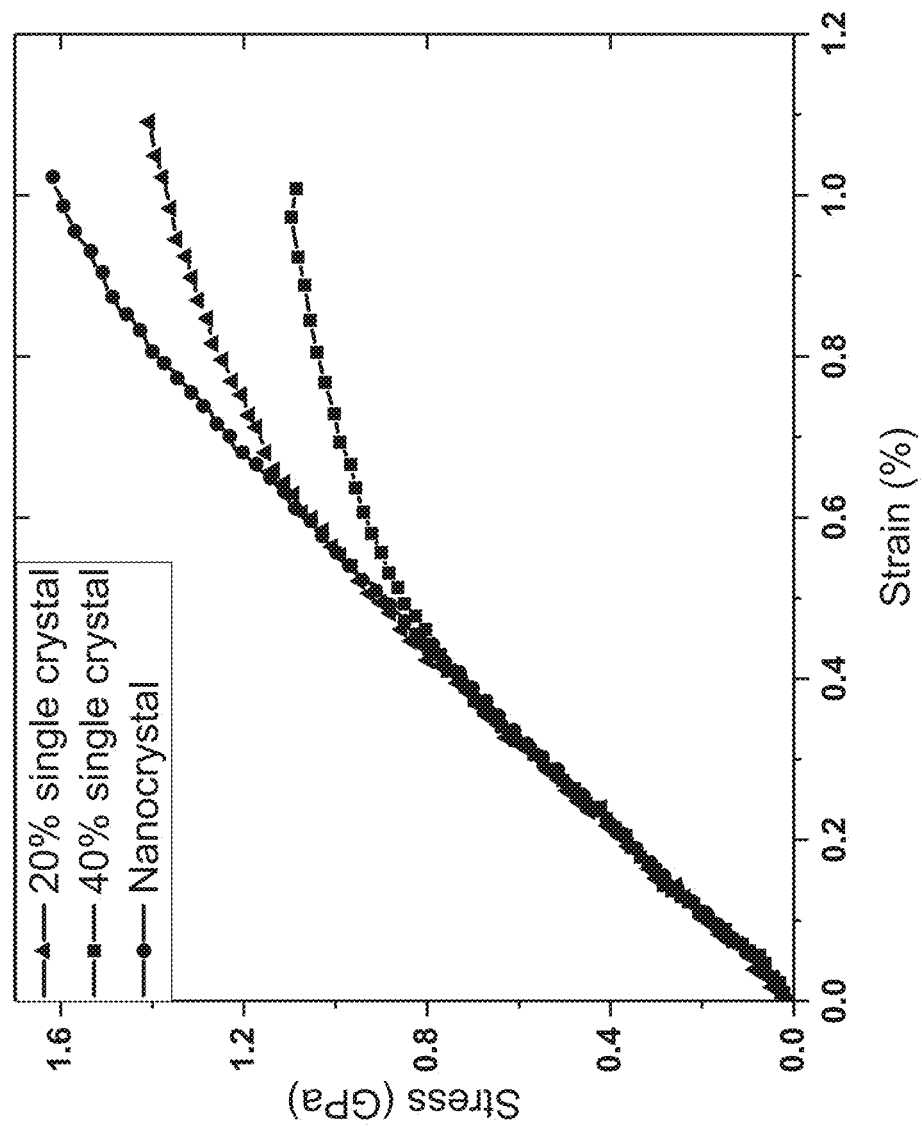

FIG. 19 illustrates mechanical behavior of multimodal microstructure iron films, illustrating the difference in mechanical behavior of 20 percent single crystal, 40 percent single crystal, and fully nanocrystalline iron films.

FIG. 20 illustrates a structure 2000 in accordance with additional examples of the disclosure. Structure 2000 includes a substrate 2002, a first layer 2004, and a second layer 2006. Substrate 2002 can be or include any of the substrate materials described herein, and can be wholly or partially removed to form a device, such as a device as described herein. First layer 2004 can be or include a multimodal film—e.g., formed according to a method described herein. Similarly, second layer 2006 can be or include a multimodal film, such as a film formed using a method as described herein. In accordance with exemplary aspects of the disclosure, first layer 2004, and second layer 2006 can include the same material. For example, first layer 2004 can include a metal, such as nickel or copper and second layer 2006 can include the same material. In these cases, first layer 2004 can be relatively thin and be formed using a vacuum or gas-phase deposition process, such as sputtering or the like, and second layer can be relatively thick and be formed by, for example, electroplating. In accordance with additional examples, first layer 2006 and second layer 2006 can be formed of different material (e.g., comprising at least one or all different elements). In some cases, the microstructure of second layer 2006 can follow the microstructure of layer 2004, e.g., the multimodal microstructure of layer 2004 can be replicated in layer 2006. By way of particular examples, when the materials of first layer 2004 and second layer 2006 are different, first layer 2004 can be or include nickel and second layer 2006 can be or include copper or vice versa.

Methods of forming a (e.g., multimodal) metallic material can be used to form material or films with desired properties. Such materials or films can be used to form devices, such as semiconductor devices and microelectromechanical devices. For example, the metallic material can be used to form resistive layers with desired/tuned resistivity and cantilevers in microelectromechanical devices.

Although exemplary embodiments of the present disclosure are set forth herein, it should be appreciated that the disclosure is not so limited. For example, although the metallic films are described in connection with various specific materials, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

We claim:

1. A method of forming a metallic material with multimodal microstructure, the method comprising the steps of:
   providing a substrate having a patterned surface comprising a first material and a second material; and
   depositing a metallic material directly over the first material and the second material to form a multimodal metallic material,
   wherein a microstructure of the first material and a microstructure of the second material are different, and
   wherein a microstructure of the metallic material deposited directly over the first material and a microstructure of the metallic material deposited directly over the second material are different.

2. The method of claim 1, wherein the first material is crystalline.

3. The method of claim 2, wherein the microstructure of the metallic material deposited directly over the first material is crystalline.

4. The method of claim 2, wherein the metallic material deposited directly over the first material is epitaxially grown.

5. The method of claim 1, wherein the second material is not monocrystalline.

6. The method of claim 5, wherein the microstructure of the metallic material deposited directly over the second material is one or more of nanocrystalline structures and ultra-fine grained structures.

7. The method of claim 6, wherein an average cross-sectional dimension of the nanocrystalline structures ranges from about 5 nm to about 100 nm and an average cross-sectional dimension of the ultra-fine grain structures ranges from about 100 nm to about 1000 nm.

8. The method of claim 1, wherein the metallic material comprises elemental metal.

9. The method of claim 8, wherein the elemental metal is selected from the group consisting of aluminum, copper, iron, nickel, silver, chromium, vanadium, titanium, and cobalt.

10. The method of claim 1, wherein the metallic material comprises an alloy.

11. The method of claim 10, wherein the alloy is selected from the group consisting of dilute alloys of aluminum, copper, iron, silver, nickel, titanium, and chromium.

12. The method of claim 1, wherein the first material comprises a material selected from the group consisting of buffer material, silicon, germanium, silicon germanium, quartz, zinc oxide, and rock salt (NaCl).

13. The method of claim 1, wherein the second material comprises a material selected from the group consisting of silicon nitride, silicon oxynitride, aluminum, titanium nitride, and aluminum oxide.

14. The method of claim 1, wherein a ratio of a surface area of the first material to a surface area of the second material ranges from about 1:0.02 to about 1:50, about 1:0.75 to about 1:1.25, or about 1:0.8 to about 1:1.2.

15. The method of claim 1, wherein the patterned surface comprises a plurality of islands of the first material, the plurality of islands having an average cross-sectional dimensions of about 500 nm to about 50000 nm.

16. The method of claim 1, wherein the patterned surface comprises a plurality of islands of the second material, the plurality of islands having an average cross-sectional dimensions of about 500 nm to about 50000 nm.

17. The method of claim 1, wherein the patterned surface comprises co-continuous or bi continuous or random patterns of the first material and the second material, with cross-sectional dimensions of about 500 nm to about 50000 nm.

18. The method of claim 1, wherein the step of depositing comprises physical vapor deposition.

19. The method of claim 1, wherein a surface of the first material and a surface of the second material are coplanar.

* * * * *